United States Patent [19]
Martin-Lopez et al.

[11] Patent Number: 5,387,822
[45] Date of Patent: Feb. 7, 1995

[54] ERROR SIGNAL ISOLATOR CIRCUIT

[75] Inventors: Fernando R. Martin-Lopez, Colorado Springs, Colo.; Richard Redl, Onnens, Switzerland

[73] Assignee: Toko America, Inc., Mount Prospect, Ill.

[21] Appl. No.: 983,797

[22] Filed: Nov. 30, 1992

[51] Int. Cl.⁶ .............................................. H03K 7/08
[52] U.S. Cl. .................... 307/125; 332/109; 323/280
[58] Field of Search ............... 323/265, 280, 281, 282, 323/284, 349; 363/41; 388/811; 318/811; 307/264, 125; 332/109

[56] References Cited

U.S. PATENT DOCUMENTS

| | | | |
|---|---|---|---|
| 4,599,571 | 7/1986 | Matsuno | 330/11 |
| 4,672,300 | 6/1987 | Harper | 323/222 |
| 4,692,598 | 9/1987 | Yoshida et al. | 219/497 |
| 4,716,510 | 12/1987 | Pace et al. | 363/49 |
| 5,113,158 | 5/1992 | Tsuji et al. | 332/109 |
| 5,264,782 | 11/1993 | Newton | 323/288 |

*Primary Examiner*—A. D. Pellinen
*Assistant Examiner*—Aditya Krishnan
*Attorney, Agent, or Firm*—William E. Hein

[57] ABSTRACT

An error signal isolator circuit for conveying an error signal across an electrical isolation boundary such as an external pulse transformer employs a level shifting process whereby a controllable voltage is measured with respect to a reference voltage and, with any gain implemented in the process, is level shifted upward such that the higher potential is referenced to a supply voltage and the lower potential is used dynamically to control the magnitude of voltage conveyed in a pulse amplitude modulation (PAM) process. In the PAM process, an ON pulse is terminated by monitoring when a PAM current has increased to a predetermined and controllable level. An ON pulse is initiated by monitoring when the voltage across a clamp diode has decayed below its normal forward bias level, indicating a commensurate decay in PAM current, following termination of the previous ON pulse.

3 Claims, 3 Drawing Sheets

ERROR SIGNAL ISOLATOR CIRCUIT

BACKGROUND AND SUMMARY OF THE INVENTION

This invention relates generally to power supplies and more particularly to a regulated voltage power supply in which the output voltage is electrically isolated from the source of power. In regulated voltage power supplies it is necessary to convey information about the status of the regulated output voltage to a power controller. This information is commonly referred to as an error voltage signal or simply an error signal. If it is desired to electrically isolate the regulated output voltage from a source of power to which the power controller is also connected, then it is necessary that the error signal be conveyed across an electrical isolation boundary.

Two devices common in the prior art and used for conveying an error signal across an electrical isolation boundary are known as an optical isolator or opto-coupler and a transformer. The opto-coupler requires that the error signal be converted to a current and then back to a voltage on the other side of the isolation boundary. The transformer used in the prior art to convey an error signal across an electrical isolation boundary is most commonly implemented as a pulse transformer, whereby the error voltage signal controls the magnitude of a voltage that is regularly impressed across one winding of the transformer and derived again from another winding. This process is known as pulse amplitude modulation (PAM).

A typical prior art circuit for deriving an error signal and conveying it via an opto-coupler to a power controller is shown in FIG. 1. In the electronics industry, the device which generates the error signal is commonly labeled a TL431 and is referred to as an adjustable shunt regulator or an adjustable zener. In the application being discussed, its primary advantage over an operational amplifier is that the reference voltage used to derive the error signal is built in. The opto-coupler can be described to have a driven side and an output side. The driven side is the LED portion of the opto-coupler and is also called an opto-LED. The output side is the light-transistor. In the prior art circuit of FIG. 1, the driven side of the opto-coupler OC is connected in series with the cathode terminal of an adjustable zener diode TL431 and a current limiting resistor RG. Usually, a second resistor RB is added in parallel with the series connection of the driven side of the opto-coupler OC and the current limiting resistor RG. The purpose of the second resistor RB is to provide a pre-load for the adjustable zener diode TL431 when the current through the series connection of the driven side of the opto-coupler OC and the current limiting resistor RG is less than the minimum current of typically 1 mA required for stable operation of the adjustable zener diode TL431. The error signal to be transferred through the isolation boundary of the converter is generated by dividing the voltage appearing between the + and − output terminals of the converter with the help of resistors RU and RL and comparing it against the internally generated reference voltage of the adjustable zener diode TL431. When the fraction of the output voltage of the converter appearing across the resistor RL becomes higher than the internal reference voltage of the adjustable zener diode TL431, the voltage between the cathode and anode of the adjustable zener diode TL431 begins to decrease. The result is that the voltage across the series connection of the driven side of the opto-coupler OC and the current limiting resistor RG increases, leading to increased current in the opto-LED within the opto-coupler OC. The increased current in the opto-LED causes an increase in the opto-transistor, leading to an increase in the voltage across the terminating resistor RV that is connected in series with the output side of the opto-coupler OC. Accordingly, an increase in the output voltage of the converter leads to an increase in the voltage across the terminating resistor RV, which is located at the other side of the isolation boundary. A compensating capacitor CFB is required in feedback systems for ensuring stability of the feedback loop. Instead of a single capacitor, more sophisticated compensating networks are also feasible.

There are two significant disadvantages associated with the prior art opto-coupler described above. In the PAM process, an ON pulse is terminated by monitoring when a PAM current has increased to a predetermined and controllable level. An ON pulse is initiated by monitoring when the voltage across a clamp diode has decayed below its normal forward bias level, indicating a commensurate decay in PAM current, following termination of the previous ON pulse.

DETAILED DESCRIPTION OF THE PREFERRED EMBODIMENT

Figure 2:
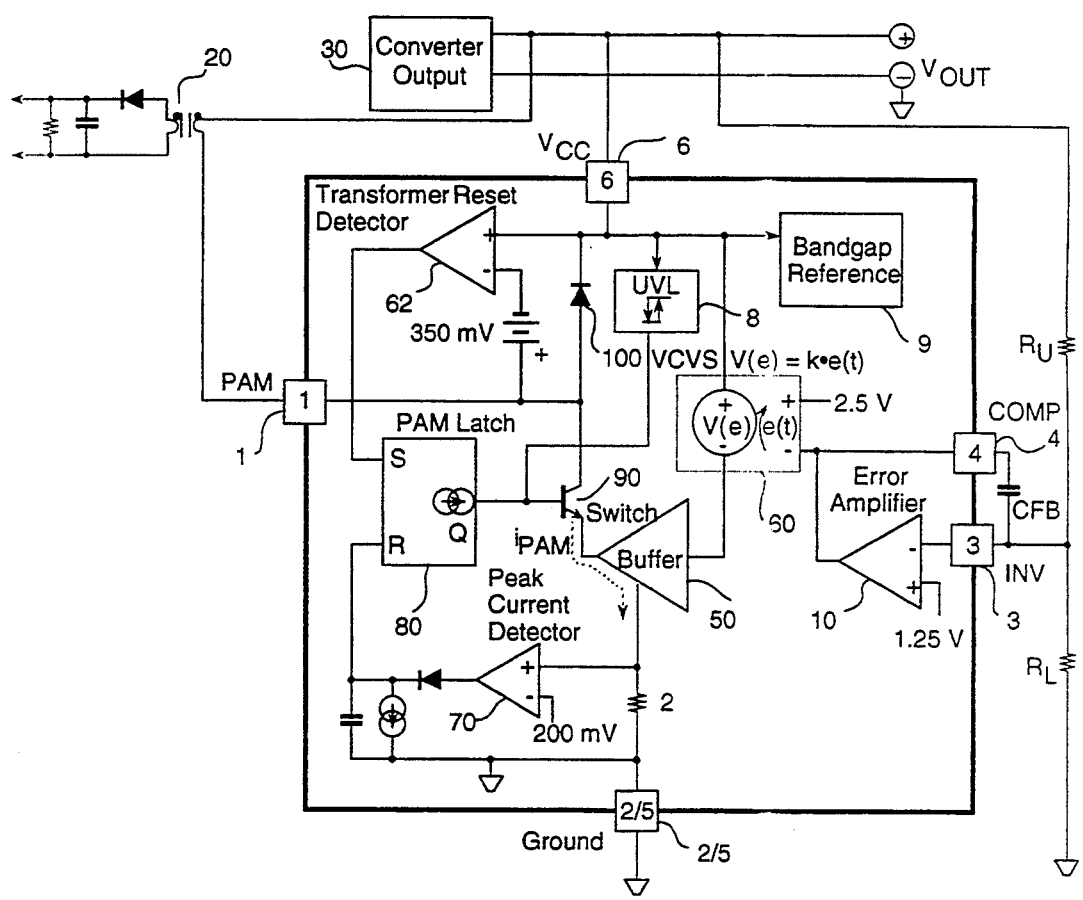
FIG. 2 is a detailed circuit diagram of an error signal isolator in accordance with the preferred embodiment of the present invention.

Referring now to FIG. 2, there is shown a detailed circuit diagram of the error isolator circuit of the present invention, which preferably is implemented as a monolithic integrated circuit designed to be employed in conjunction with an external pulse transformer 20 to convey an error voltage signal across an electrical isolation barrier via pulse amplitude modulation (PAM). The simplest means of re-deriving the error signal from the transformer winding is by peak detection, as implemented in the circuit of FIG. 2. In its simplest form, the error signal isolator circuit may be a six-pin integrated circuit package, with pin 6 being connected to a source of operating voltage Vcc, pin 4 being a compensation pin that provides an error amplifier output, pin 3 being an error amplifier inverting input, pin 1 providing a pulse amplitude modulated (PAM) driver output, and pin 2/5 being connected to ground. The error signal isolator circuit provides the functions of peak current limiting, self-oscillating PAM drive, volt-second balance control, under-voltage lockout, and precision reference.

Figure 1:
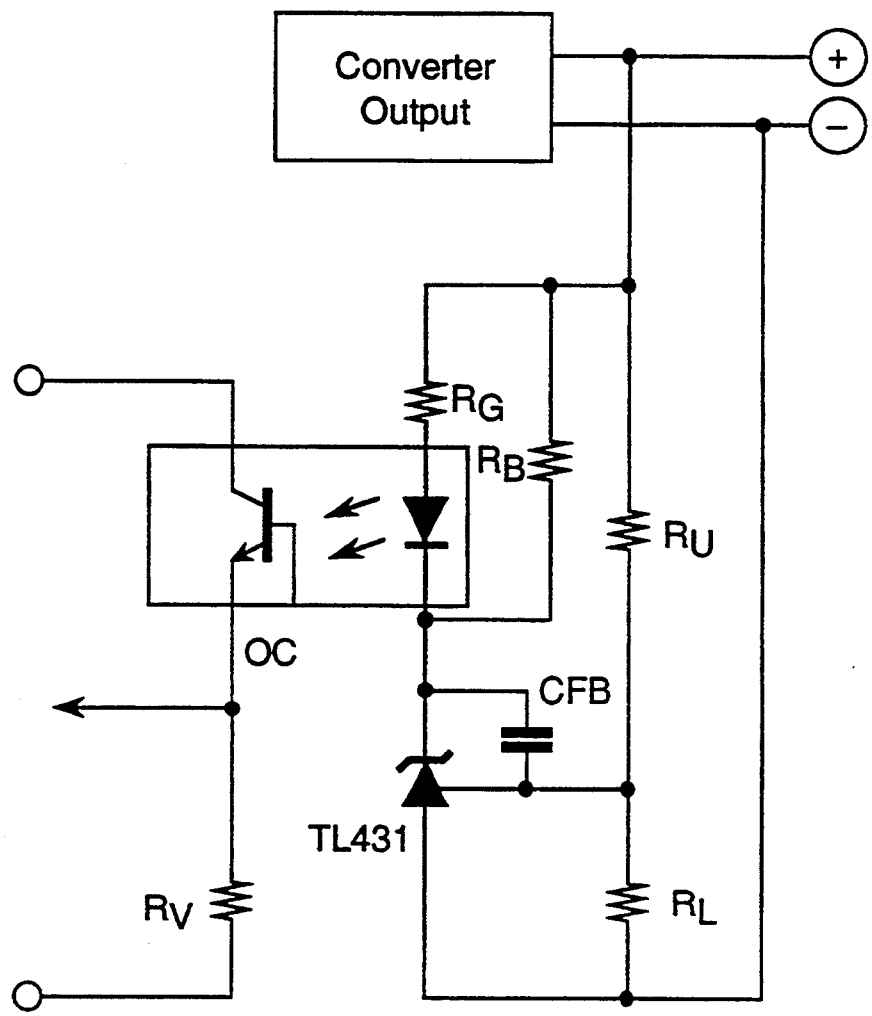
FIG. 1 is a schematic diagram of a prior art optical isolator circuit.

In an application comparable to one that may employ the prior art TL431 circuit of FIG. 1, the error signal isolator circuit of FIG. 2 is powered by an external power supply 30 that provides a source of operating voltage Vcc. The operating voltage Vcc is monitored through a resistive divider comprising resistors RU and RL at pin 3. Compensation of an error amplifier 10 is available at pin 4. An internal reference voltage of nominally 1.25 volts is applied to the non-inverting input of the error amplifier 10. The voltage at the output of error amplifier 10, available at pin 4, is the error voltage. The difference between this error voltage and a fixed reference of nominally 2.5 volts is then amplified by a factor of approximately 1.5 and level shifted up to the Vcc bus, pin 6. It is then applied to a buffer 50 and used as the negative potential for the pulse amplitude modulation process. Buffer 50 prevents overloading of a level shifting circuit 60 and carries a nominal maximum of 100 mA. of current. Monitoring current of the buffer 50 is sensed through the combination of a resistor 69 and peak current detector 70. Pulse amplitude modulation occurs in the process of forcing the potential of one side of the external pulse transformer 20 to the buffered voltage potential while the other side of the pulse transformer 20 is connected to the output of power supply 30 which also serves as the source of operating voltage Vcc for the error signal isolator circuit.

An under voltage lockout (UVL) 8 senses supply voltage Vcc and locks out operation of the error signal isolator circuit if supply voltage Vcc is too low. A bandgap reference 9, controlled by UVL 8, comprises a precision voltage reference stabilized over temperature and serves to power the remainder of the error signal isolator circuit.

The level shifting process performed by level shifting circuit 60 employed in the error signal isolator circuit of FIG. 2 serves to eliminate the undesirable zero introduced to the control loop by the configuration of the prior art TL431 circuit. In the present error signal isolator circuit, changes in the output voltage Vout result in changes of the same magnitude in the buffered voltage that drives the pulse transformer 20. Since the pulse amplitude modulation voltage magnitude is the difference between the output voltage Vout and the buffered voltage, it remains unchanged with changes in the output voltage.

A further benefit is realized by the level shifting process employed in the error signal isolator circuit of FIG. 2. Since the output voltage range of the error amplifier 10 is limited to between 0 volts and approximately 2.5 volts, the buffered voltage will also be limited. Its minimum voltage below the supply rail is 2.5 volts times the gain of the level shift circuit. Thus, the voltage forced across the pulse transformer 20 is similarly limited. Therefore, the pulse transformer 20 need not be modified for use with power supplies that provide a higher output voltage. The same characteristics of the pulse amplitude modulation process will be exhibited, regardless of the output voltage level.

Figure 3:
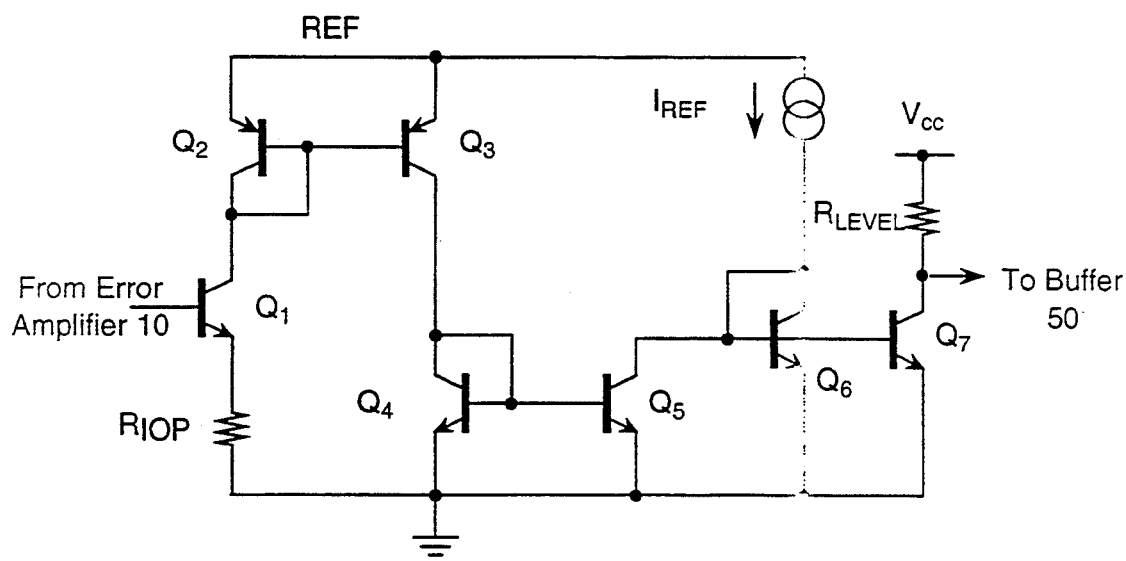
FIG. 3 is a detailed circuit diagram of a level shifting circuit employed in the error signal isolator circuit of FIG. 2.

Referring now to FIG. 3, there is shown a detailed schematic diagram of circuitry comprising the level shifting circuit 60 that performs the level shifting process described above. As set forth above, the voltage on pin 4 is the error signal voltage with respect to ground. The level shifting circuit of FIG. 3 is employed to reference this error signal voltage with respect to Vcc in order to eliminate the zero introduced to the control loop. One way to perform this ground to Vcc referenced level shift is to create a reference current Iref. When the output of the error amplifier 10 is as high as possible, transistor Q1 will create a current which will be subtracted from current Iref by transistor Q5. If the maximum current that transistor Q1 can sink is Iref, then resistor Rlevel will pull to supply voltage Vcc since transistors Q7 and Q6 will be turned off. If supply voltage Vcc is moving up or down, the buffer 50 will follow.

When the output of the error amplifier 10 is at its minimum, all of the current Iref will flow through resistor Rlevel, thereby forcing the maximum voltage swing across that resistor. Again, even if supply voltage Vcc changes, the voltage across resistor Rlevel will be directly proportional to the maximum voltage level at the output of the error amplifier 10. It is important to note that the maximum swing in the output of the error amplifier 10 with respect to ground can be multiplied through resistor Rlevel. As this resistance increases, the swing of the output of the error amplifier can be increased by the ratio of resistor Rlevel to resistor Riop.

Since magnetic components, such as external pulse transformer 20 employed in the error signal isolator circuit of the present invention, will not permit a DC voltage to be continuously impressed across a winding, an oscillator must be used to switch the pulse amplitude modulation voltage across the winding for a limited period of time and to then release the forced condition, thereby allowing the pulse transformer 20 to reset itself. While it is common practice to force the pulse amplitude modulation voltage for a fixed period of time at a fixed frequency, this approach has a dangerous disadvantage. If the current being forced into the external pulse transformer 20 via the forced pulse amplitude modulation voltage is not monitored, the core of pulse transformer 20 may saturate and cause destruction of the device that is driving it. If the core or inductance of pulse transformer 20 is too small, or if the reset time or voltage is insufficient, this undesirable result may occur.

The oscillator employed in the error signal isolator circuit of FIG. 2 comprises a transformer reset detector 62, peak current detector 70, and a PAM latch 80 and is designed to protect the error signal isolator circuit from driving the external pulse transformer 20 to destructive current levels. When the pulse amplitude modulation voltage at pin 1 is forced across the pulse transformer 20, the current flow in external pulse transformer 20 is monitored by the peak current detector 70 using Ipam as a sensing current. When it reaches a predetermined level, nominally 100 mA., the pulse is terminated by a transistor switch 90 turning off. The current in the external pulse transformer 20 will force pulse amplitude modulation voltage at pin 1 of error signal isolator circuit to rise above the supply voltage Vcc by the amount of the voltage drop across a diode 100, typically 0.6 volts to 0.8 volts. When the current flowing in external pulse transformer 20 has decayed substantially, such that the voltage drop across diode 100 decays substantially as well, that information is used to reinitiate the pulse amplitude modulation voltage at pin 1 by turning on transistor switch 90. The result is a critically continuous mode self-oscillator circuit.

We claim:

1. An error signal isolator circuit for conveying an error signal across an electrical isolation boundary such as an external pulse transformer, the error signal isolator circuit comprising:
   error amplifier means for measuring a controllable external supply voltage with respect to a reference voltage and for providing an error voltage signal;
   level shifting means coupled to the error amplifier means for receiving the error voltage signal and for altering said error voltage signal to provide a shifted error voltage signal, the magnitude of which is negatively proportional to said error voltage signal and which is referenced to the external supply voltage of said error signal isolator circuit; and pulse amplitude modulation means for receiving said shifted error voltage signal and for selectively switching said shifted error voltage signal across a winding of said external pulse transformer, said winding being connected to said external supply voltage.

2. An error signal isolator circuit as in claim 1 wherein said pulse amplitude modulation means further comprises:

peak current detector means for monitoring a current flowing in a winding of said external pulse transformer; and switch means for selectively switching said shifted error voltage signal across said winding of said external pulse transformer, said switch means being connected to said peak current detector means and responsive thereto for turning off said said switch means when said current flowing in said winding of said external pulse transformer increases to a predetermined level.

3. An error signal isolator circuit as in claim 2 wherein said pulse amplitude modulation means further comprises a clamp diode connected in parallel with said winding of said external pulse transformer, said clamp diode providing a path for the flow of said current in said winding of said external pulse transformer when said switch means is turned off; and transformer reset detector means, connected to said switch means, for monitoring said current flowing in said winding of said external pulse transformer, said transformer reset detector means being operative for turning on said switch means when said current flowing in said winding of said external pulse transformer decays to substantially zero.

* * * * *